United States Patent
Dogiamis et al.

(10) Patent No.: US 12,469,630 B2
(45) Date of Patent: Nov. 11, 2025

(54) INDUCTOR AND TRANSFORMER SEMICONDUCTOR DEVICES USING HYBRID BONDING TECHNOLOGY

(71) Applicant: Intel Corporation, Santa Clara, CA (US)

(72) Inventors: Georgios Dogiamis, Chandler, AZ (US); Qiang Yu, Saratoga, CA (US); Adel Elsherbini, Tempe, AZ (US); Kimin Jun, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 517 days.

(21) Appl. No.: 17/359,165

(22) Filed: Jun. 25, 2021

(65) Prior Publication Data
US 2022/0415555 A1 Dec. 29, 2022

(51) Int. Cl.
*H01L 23/64* (2006.01)
*H01F 27/28* (2006.01)
*H01L 23/522* (2006.01)
*H01L 25/00* (2006.01)
*H01L 25/065* (2023.01)
*H10D 1/20* (2025.01)

(52) U.S. Cl.
CPC ..... *H01F 27/2804* (2013.01); *H01L 23/5227* (2013.01); *H01L 23/645* (2013.01); *H01L 25/0657* (2013.01); *H01L 25/50* (2013.01); *H10D 1/20* (2025.01)

(58) Field of Classification Search
CPC ............... H01L 23/645; H01L 23/5227; H01L 21/768–76898; H01L 23/522–53295
See application file for complete search history.

(56) References Cited

U.S. PATENT DOCUMENTS

| | | | |
|---|---|---|---|
| 9,654,004 B1 | 5/2017 | Deligianni et al. | |
| 2005/0098896 A1* | 5/2005 | Huang | H01L 23/53295 257/E23.161 |
| 2009/0188104 A1 | 7/2009 | Ching et al. | |
| 2011/0267864 A1* | 11/2011 | Suzuki | G11C 5/02 365/51 |
| 2017/0025381 A1* | 1/2017 | Tsai | H01L 21/76877 |
| 2017/0229509 A1* | 8/2017 | Lee | H01L 27/14689 |
| 2018/0323147 A1 | 11/2018 | Kirby | |

(Continued)

FOREIGN PATENT DOCUMENTS

| | | |
|---|---|---|
| DE | 102020114141 | 4/2021 |
| EP | 0851439 | 7/1998 |

OTHER PUBLICATIONS

European Patent Office, "The extended search report," issued in connection with EP Application No. 22178888.8, mailed on Dec. 12, 2022, 13 pages.

(Continued)

*Primary Examiner* — Kevin Parendo
(74) *Attorney, Agent, or Firm* — Hanley, Flight & Zimmerman, LLC

(57) ABSTRACT

Methods and apparatus for inductor and transformer semiconductor devices using hybrid bonding technology are disclosed. An example semiconductor device includes a first standoff substrate; a second standoff substrate adjacent the first standoff substrate; and a conductive layer adjacent at least one of the first standoff substrate or the second standoff substrate.

12 Claims, 12 Drawing Sheets

(56) References Cited

U.S. PATENT DOCUMENTS

| | | | |
|---|---|---|---|
| 2019/0259677 A1* | 8/2019 | Lasiter | H01L 21/76802 |
| 2019/0385780 A1 | 12/2019 | Xu et al. | |
| 2020/0075553 A1* | 3/2020 | Delacruz | H01F 17/0013 |
| 2021/0035905 A1* | 2/2021 | Shih | H01L 23/481 |
| 2021/0066192 A1* | 3/2021 | Chen | H01L 25/0657 |
| 2021/0118827 A1* | 4/2021 | Chen | H01L 24/09 |
| 2022/0165665 A1* | 5/2022 | Chang | H01L 24/80 |
| 2022/0336431 A1 | 10/2022 | Yu et al. | |

OTHER PUBLICATIONS

European Patent Office, "Communication Pursuant to Article 94(3) EPC," issued in connection with European Patent Application No. 22178888.8, dated Mar. 20, 2025, 6 pages.

\* cited by examiner

INDUCTOR AND TRANSFORMER SEMICONDUCTOR DEVICES USING HYBRID BONDING TECHNOLOGY

FIELD OF THE DISCLOSURE

This disclosure relates generally to semiconductors, and, more particularly, to inductor and transformer semiconductor devices formed using hybrid bonding.

BACKGROUND

In semiconductor electronics, resistivity is a measure of a material's resistance to a flow of an electric current. A low resistivity substrate or other semiconductor material has a low resistance to flow of electrical current and, as such, is highly conductive. Placing two materials with low resistivity in close proximity to each other can distort an associated magnetic field, reduce an associated quality factor, and reduce performance of the part formed by the two materials.

Figure 1:
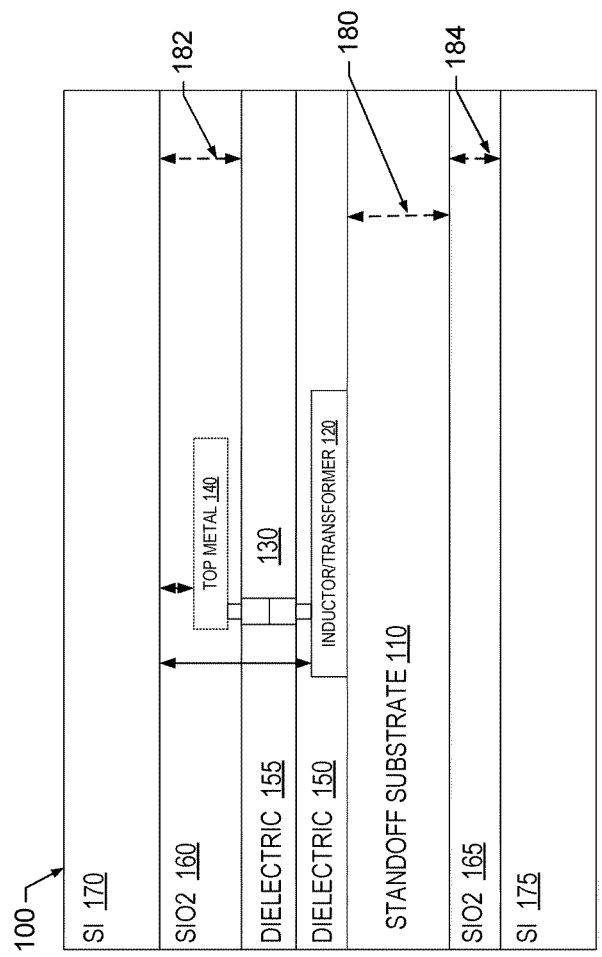
FIG. 1 is a cross-section of an example semiconductor device.

The figures are not to scale. Instead, the thickness of the layers or regions may be enlarged in the drawings. Although the figures show layers and regions with clean lines and boundaries, some or all of these lines and/or boundaries may be idealized. In reality, the boundaries and/or lines may be unobservable, blended, and/or irregular. Additionally, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined, e.g., using scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

In general, the same reference numbers will be used throughout the drawing(s) and accompanying written description to refer to the same or like parts. As used herein, unless otherwise stated, the term "above" describes the relationship of two parts relative to Earth. A first part is above a second part, if the second part has at least one part between Earth and the first part. Likewise, as used herein, a first part is "below" a second part when the first part is closer to the Earth than the second part. As noted above, a first part can be above or below a second part with one or more of: other parts therebetween, without other parts therebetween, with the first and second parts touching, or without the first and second parts being in direct contact with one another. Notwithstanding the foregoing, in the case of a semiconductor device, "above" is not with reference to Earth, but instead is with reference to a bulk region of a base semiconductor substrate (e.g., a semiconductor wafer) on which components of an integrated circuit are formed. Specifically, as used herein, a first component of an integrated circuit is "above" a second component when the first component is farther away from the bulk region of the semiconductor substrate than the second component. As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween.

As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name. As used herein, "approximately" and "about" refer to dimensions that may not be exact due to manufacturing tolerances and/or other real world imperfections. As used herein, "processor circuitry" is defined to include (i) one or more special purpose electrical circuits structured to perform specific operation(s) and including one or more semiconductor-based logic devices (e.g., electrical hardware implemented by one or more transistors), and/or (ii) one or more general purpose semiconductor-based electrical circuits programmed with instructions to perform specific operations and including one or more semiconductor-based logic devices (e.g., electrical hardware implemented by one or more transistors). Examples of processor circuitry include programmed microprocessors, Field Programmable Gate Arrays (FPGAs) that may instantiate instructions, Central Processor Units (CPUs), Graphics Processor Units (GPUs), Digital Signal Processors (DSPs), XPUs, or microcontrollers and integrated circuits such as Application Specific Integrated Circuits (ASICs). For example, an XPU may be implemented by a heterogeneous computing system including multiple types of processor circuitry (e.g., one or more FPGAs, one or more CPUs, one or more GPUs, one or more DSPs, etc., and/or a combination thereof) and application programming interface(s) (API(s)) that may assign computing task(s) to whichever one(s) of the multiple types of the processing circuitry is/are best suited to execute the computing task(s).

DETAILED DESCRIPTION

In the following detailed description, reference is made to the accompanying drawings that form a part hereof, and in which is shown by way of illustration specific examples that may be practiced. These examples are described in sufficient detail to enable one skilled in the art to practice the subject matter, and it is to be understood that other examples may be utilized and that logical, mechanical, electrical and/or other changes may be made without departing from the scope of the subject matter of this disclosure. The following detailed description is, therefore, provided to describe example implementations and not to be taken as limiting on the scope of the subject matter described in this disclosure. Certain features from different aspects of the following description may be combined to form yet new aspects of the subject matter discussed below.

Apparatus, articles of manufacture, and methods to form inductors, transformers, and/or other similar semiconductor components using a top layer of intermediate standoff substrate are provided. Apparatus, articles of manufacture, and methods to form high quality (Q) factor and high self-resonant frequency (SRF) devices, such as inductors, transformers, etc., are provided.

For example, the Q factor of an inductor is a ratio of an inductive reactance of the inductor to a resistance of the inductor at a frequency. The Q factor represents or measures an efficiency of the inductor or other similar semiconductor device (e.g., transformer, choke, etc.). The higher the Q factor of the inductor, the closer the inductor approaches the behavior of an "ideal" inductor. High Q factor inductors are used with capacitors to form resonant circuits in radio transmitters and receivers, for example. The higher the Q factor is, the narrower a bandwidth of the resonant circuit, for example.

The SRF of an inductor is a frequency at which a parasitic capacitance of the inductor resonates with an ideal inductance of the inductor, resulting in a very high impedance such that, at this frequency, the inductor device operates as an open circuit. As the frequency rises, the impedance of the parasitic capacitance drops until a magnitude of the impedance equals that of the ideal inductance. The point at which this occurs is the SRF. The inductor reacts as an inductor up to its SRF. At the SRF, the impedance of the inductor is high, and the inductor can be used as a choke to attenuate signals near at the SRF.

On-chip inductors and/or transformers can suffer from significant loss and lower SRF due to low substrate resistivity, for example. Certain examples solve these problems by using a top layer of intermediate standoff substrate to form high Q factor and high SRF inductors/transformers.

For example, placing two materials with low resistivity in close proximity to each other can distort an associated magnetic field, reduce an associated Q factor, and reduce performance of the part (e.g., an inductor, a transformer, etc.) formed by the two materials. An increase in a number of metals used in semiconductor process technology can increase a distance between inductor coils and lossy substrate and improve the Q factor as well as the SRF associated with the part formed by the semiconductor process. Alternatively or additionally, a patterned ground shield can increase the Q factor of inductors/transformers on silicon. However, increasing a number of metals adds more cost to the technology and complicates manufacturing. Further, the placement of additional metals/vias in a back-end stack can lead to interconnect loss between transistors and an inductor coil, which is built on top metal. The patterned ground shield has limited usage at millimeter wave frequencies since the metal shield introduces parasitic capacitances and reduces SRF.

To address these deficiencies, certain examples use a top layer of an intermediate standoff substrate to form high Q factor and high SRF inductors/transformers. By building inductors/transformers on the top layer of the intermediate standoff substrate, a distance between the inductor coil and a lossy silicon substrate is approximately doubled, for example. By increasing the distance between the inductor coil and the lossy silicon substrate, an effect of a dominant loss factor for on-chip passive devices is reduced. Certain examples provide a new inductor/transformer design on an intermediate standoff substrate positioned between two silicon chips assembled using hybrid bonding technology.

Using hybrid bonding for semiconductor packaging enables two dies, wafers, etc., to be bonded at one micron, for example. Using hybrid bonding, dies can be positioned farther apart such that the inductor is farther away from at least one of two substrates forming the package in which the inductor is implemented, for example. Hybrid bonding enables die stacking to provide performance improvement, decreased interconnect parasitics, and reduced interconnect power.

Advanced processing systems involve high bandwidth and low power interconnects between subsystems. For example, high bandwidth enables faster processing speeds for bandwidth-limited workloads. Hybrid bonding allows scaling of die to die interconnect pitch, for example, to enable heterogeneously integrated processors, etc.

Rather than solder micro-bumps used in conventional thermo-compression bonding solder attach, hybrid bonding replaces solder-capped copper pillars or bumps with copper pads that are virtually co-planar with the die surface. The die surfaces are processed through chemical mechanical polishing (CMP) to flatten and smooth a dielectric surface. Local surface roughness is minimized or otherwise reduced (e.g., below 1 nanometer (nm), etc.) to help ensure strong dielectric-dielectric bonding. Each hybrid bond pad (e.g., copper pad, etc.) includes a controlled recess to accommodate copper expansion and good electrical connectivity. An electrical connection is formed by contacting two dies, which are then heated, causing the facing copper pads to expand and contact each other to form electrical connections. The dielectric materials bond, and the copper pads inter-diffuse to form a metal bond that is maintained after the dies cool.

Whereas solder bumps can be ten, thirty-forty, or more microns in height, using hybrid bonding, a bond between two dies or wafers can be reduced to one micron, for example. As such, removing bump layers and replacing solder bumps with hybrid bonding can be beneficial for reduced spacing and achieving higher quality bonds, but standoff spacing is then involved with such a hybrid bonding arrangement. Particularly for inductors and transformers, such devices can be impacted by the reduced spacing.

Hybrid bonding with smaller pitch reduces parasitics such as electrostatic discharge (ESD), fan-out and fan-in routing, bump capacitive parasitics, etc. Fine pitch provided in hybrid bonding enables zero or almost zero fan-out/fan-in between transmitter and receiver, and smaller connection pads have lower parasitics compared to larger solder connections. Lower parasitics correlate to a lower total parasitic capacitance, which results in lower link power and enables use of smaller drivers to provide greater circuit scaling.

FIG. 1 is a cross-section of an example semiconductor device, such as an inductor, transformer, etc., built on a standoff substrate. In the example of FIG. 1, an intermediate substrate provides a base to build one or more inductors, transformers, etc. As shown in FIG. 1, a distance between an inductor coil and a lossy silicon substrate is greater than a traditional top metal on-chip passive device. More specifically, FIG. 1 illustrates an example device 100 including a standoff substrate 110 on which an inductor/transformer 120 is built. A metal pattern 130 connects the inductor/transformer device 120 to a top metal layer 140.

As shown in the example of FIG. 1, the example inductor/transformer 120 is formed in a first dielectric 150 with the metal pattern (e.g., metal bond pads) 130 extending through a second dielectric 155 to connect to the top metal 140 in a die backend such as a silicon dioxide ($SiO_2$) layer 160. The die backend can be another material such as a passivation layer formed of silicon nitride (SiN), etc. A silicon (Si) layer or die 170 completes the top of the example semiconductor device 100. On the other side of the standoff substrate 110, a second die backend (e.g., $SiO_2$, SiN, etc.) layer 165 and a second Si layer or die 175 enclose the inductor/transformer 120 to form the example semiconductor electronic device 100.

In certain examples, the standoff substrate 110 can include the outer dielectric layers 150 and 155 (e.g., silicon dioxide ($SiO_2$)) and the metal bond pads 130 that are compatible with die stacking using hybrid bonding technology. The outer dielectric layers 150, 155 can be on both sides of the standoff substrate 110 (not shown for clarity). The standoff substrate 110 can include a plurality of through substrate vias (TSVs) which are not shown for clarity.

Generally, a standoff substrate, such as the standoff substrate 110 of the example of FIG. 1, is a body or layer composed of a dielectric material, a low loss polymer, glass, silicon, alumina, silicon dioxide (SiO2), silicon nitride (Si3N4), aluminum nitride (AlN), silicon carbon nitride (SiCN), ceramic filled polymer, and/or any other material (e.g., organic and non-organic). In some examples, the standoff substrate includes a dielectric material. The standoff substrate can have a dielectric constant that can range between about 3 (e.g., organic polymers, glass ~4) and 12 (e.g., silicon ~11.7, alumina ~10). In some examples, the standoff substrate can be an interposer. An interposer can include, in addition to the TSVs, any number of plies, laminates, trenches, and/or layers, some or all of which may contain any number of conductive traces, other vias (e.g., separate from the TSVs), and/or similar structures.

Figure 4:
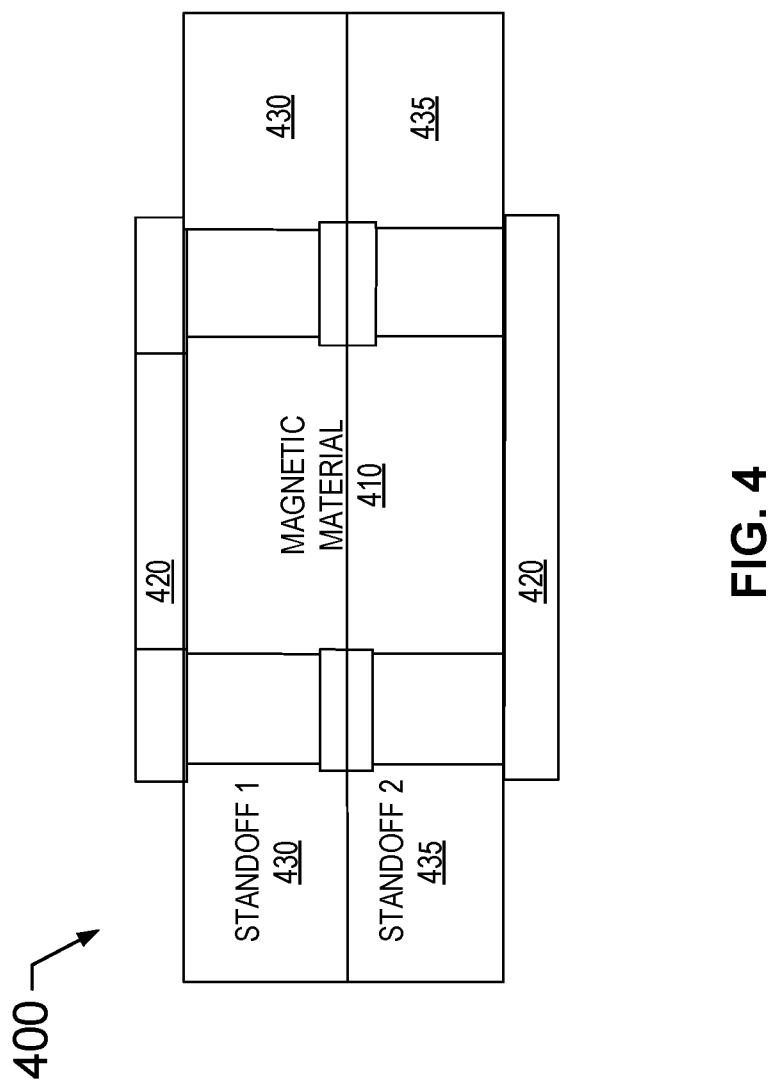
FIG. 4 is a block diagram of an example coil-type semiconductor device including a magnetic material wrapped by conductive routing.

In the example of FIG. 1, the standoff substrate 110 has a substrate thickness 180 in a z-direction of a reference cartesian coordinate system (e.g., a vertical or stack-up direction in the orientation of FIG. 4). The standoff substrate 110 thickness 180 can be approximately 10 to 50 times greater than a backend layer thickness 182, 184 of the backend layers 160 and 165. For example, the backend layer 160/165 thickness can be between approximately 0.1 and 5 micrometers. For example, the standoff substrate 110 thickness 180 can be approximately between 5 micrometer and 400 micrometers.

Increasing a thickness of the standoff substrate 110 enables an increased distance or separation in the z-direction between the backend layers 160 and 165 of the semiconductor die 170 and the semiconductor die 175. A greater an amount of separation between the semiconductor dies 170 and 175 in the z-direction reduces signal loss and/or signal interference, thereby improving performance (e.g., improving inductor quality for an inductor implemented on the standoff substrate 110). An associated fabrication process allows standoff substrates to be fabricated at a wide range of thicknesses for different purposes (e.g., 5 µm up to 400 µm or more). Additionally, hybrid bonding allows for multiple standoff substrates to be stacked on top of each other. Thus, in some examples, two or more standoff substrates (e.g., standoff substrates 430 and 435 shown and described in connection with FIG. 4, and/or other standoff substrates) are stacked between dies (e.g., dies 170 and 175). Furthermore, in some examples, the multiple stacked standoff substrates may be of different/heterogeneous thicknesses.

In certain examples, an inductor can be implemented using two-turn and/or other multi-turn structures with standoff substrates deposited or otherwise positioned between two hybrid bonded dies. A hybrid bonding layer is used to bond a top layer to a composite structure, for example.

Figure 2:
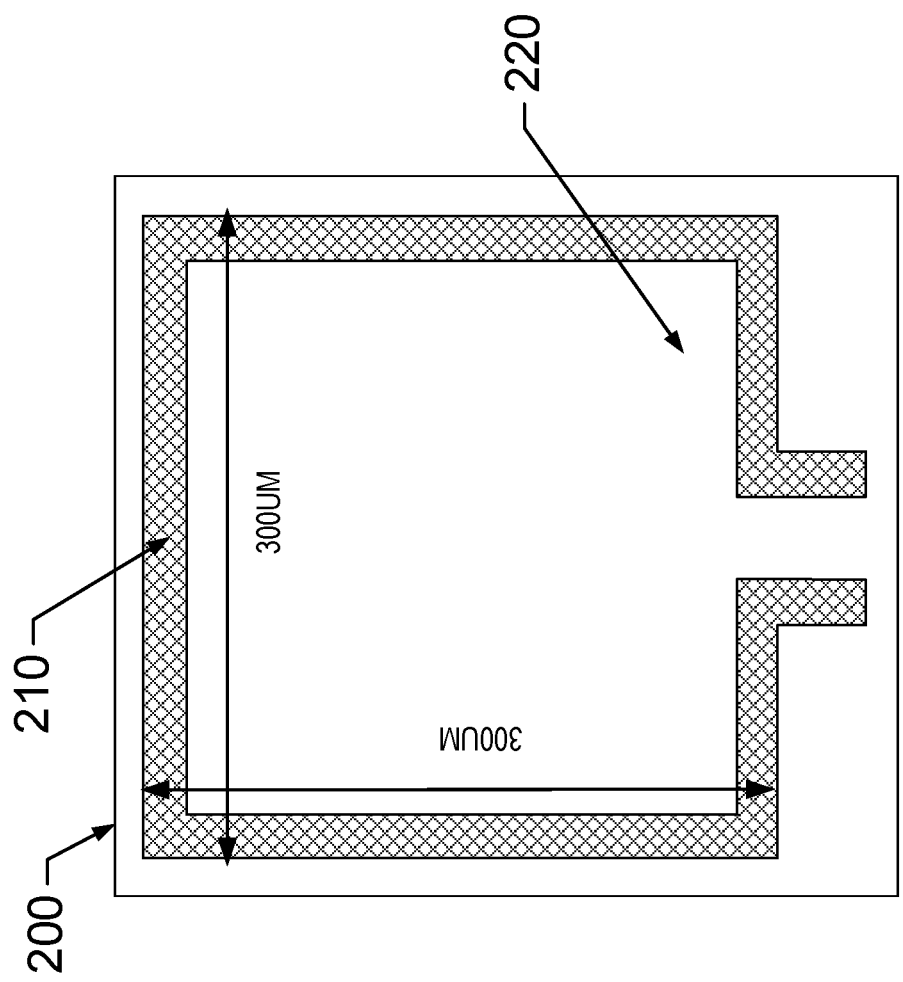
FIG. 2 is an example inductor built on a standoff substrate.

FIG. 2 is an example inductor 200 built on a standoff substrate 210 (e.g., glass, high-resistivity silicon etc.). FIG. 2 shows an example planar, top-down view of the inductor 200 circuit. The standoff substrate 210 is deposited on a die backend metal layer 220 to form the example inductor 200.

Figure 3:
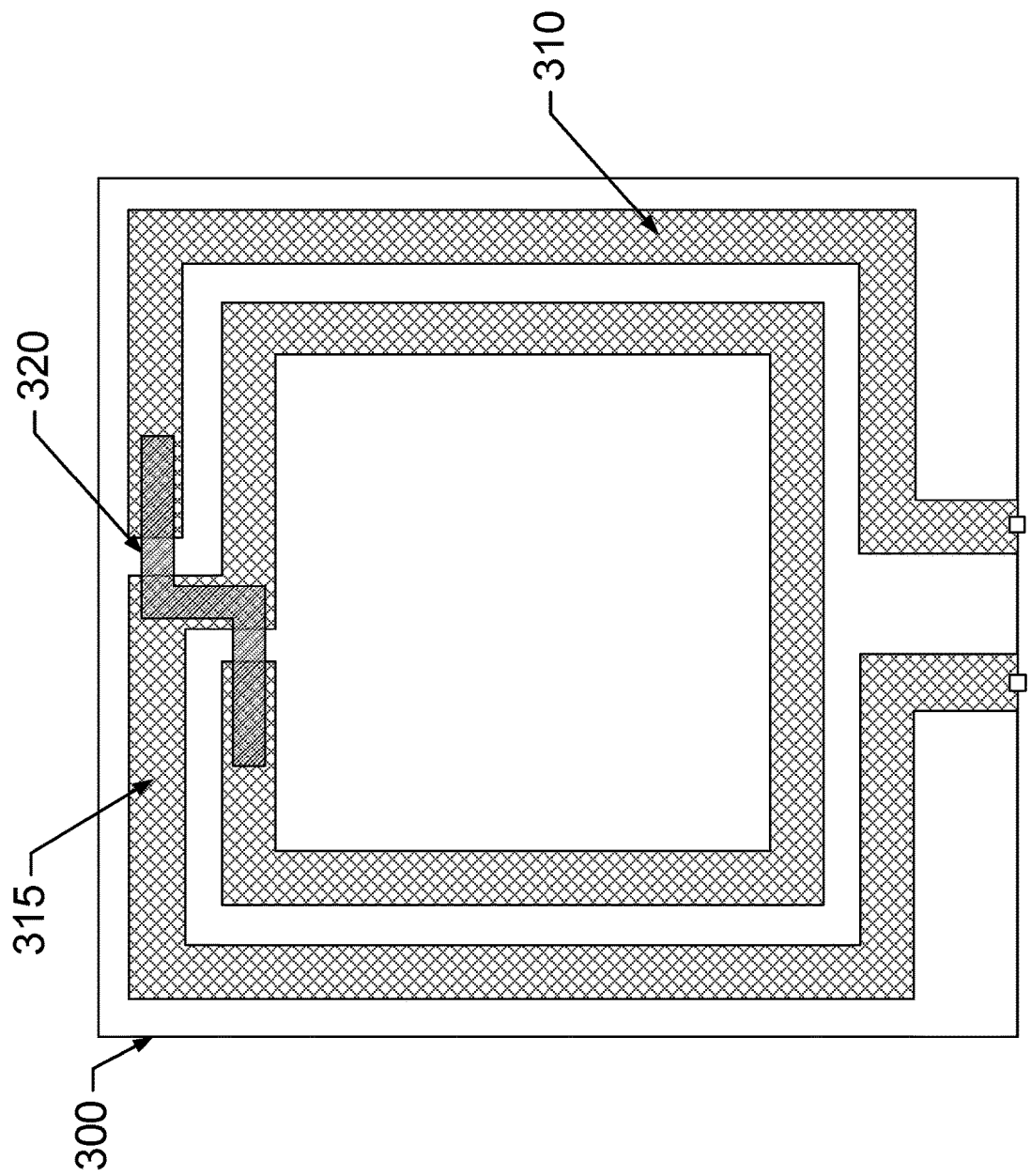
FIG. 3 is an example multi-turn inductor built on a standoff substrate and underpass.

FIG. 3 is an example multi-turn inductor 300 built on a standoff substrate 310-315 and an underpass 320. Multiple turn inductors 300 such as illustrated in the example of FIG. 3 can be built with the standoff substrate 310-315 with additional metal layer(s) used for the underpass 320, for example. Alternatively or additionally, the multiple turn inductor 300 can be built using the standoff substrate 310-315 with the top metal layer 140 and the metal pattern 130 (of the example of FIG. 1) to form the underpass 320. The combination of the standoff substrate 310-315 and the under path 320 connecting the standoff substrate 310-315 forms the example multi-turn inductor 300.

In certain examples, inductors 200, 300 built on the standoff substrate 210, 310-315 and the top metal 140 provide different qualities. For example, one example single turn inductor coil may have an area of 300 micrometers (µm)×300 µm and a width of 10 µm. By adding the standoff substrate 210, 310-315 to a silicon substrate, a distance between the inductor 200, 300 and the lossy silicon substrate is increased. The inductor 200, 300 is built all or partially on the standoff substrate 210, 310-315. By increasing the distance, a quality (Q) factor of the example inductor 200, 300 built on the standoff substrate 210, 310-315 is increased from 23.52 to 27.70 (e.g., a 17.9% increase), and the SRF is increased from 53 gigahertz (GHz) to 56.5 GHz (e.g., a 6.6% increase) compared to an inductor built with no standoff substrate layer.

FIG. 4 is a block diagram of an example coil-type semiconductor device 400 including a magnetic material 410 wrapped by conductive routing 420 (e.g., forming a metal layer). Rather than a planar device, as shown in the examples of FIGS. 2-3, FIG. 4 illustrates a coil-type, vertical implementation with a center core of material 410 and vias (e.g., conductive wires and/or other conductive routing material) 420 wrapping around the core. The example of FIG. 4 is shown with the magnetic material 410 in the center, but the semiconductor device 400 can be implemented without magnetic material 410 as well, just using standoff material in a larger footprint. The magnetic material can also be outside the center or core of the semiconductor device 400. Using magnetic material increases inductance and reduces the size of the device, for example.

In the example of FIG. 4, the semiconductor device 400 (e.g., an inductor, transformer, choke, etc.) is formed using the magnetic material 410 (e.g., a ferromagnetic material or ferrimagnetic material such as iron, ferrite, nickel, cobalt, alloys, etc.) partially in place of standoff substrate 430, 435 material to provide an electrical-magnetic component 400 such as a transformer, inductor, choke, etc. The magnetic structure 410 can be built on a split half and/or single standoff structure. As shown in the example of FIG. 4, the conductive routing material 420 can be added in a structure that encapsulates the magnetic material 410, or the magnetic material 410 can encapsulate the conductive routing material 420.

As shown in the example of FIG. 4, the coil-type semiconductor device 400 can include a split standoff structure including standoff substrates 430, 435 around the magnetic material 410. The conductive routing material 420 coils around the standoff substrates 430, 435 and the magnetic core material 410. The conductive routing material 420 can be formed from a redistribution layer (RDL), backend interconnect, etc. For example, the RDL is a metal layer on a chip or other semiconductor device that enables bonding in multiple locations. The RDL can be used to spread contact points and facilitate interconnect with other chips, for example. The backend interconnect results from integrated circuit fabrication and enables devices (e.g., inductors, transformers, transistors, capacitors, resistors, etc.) to interconnect. The conductive wire or routing material 420 forms the inductor and/or other semiconductor device 400 and enables the device 400 to interconnect or bond with another device, for example.

Figure 5:
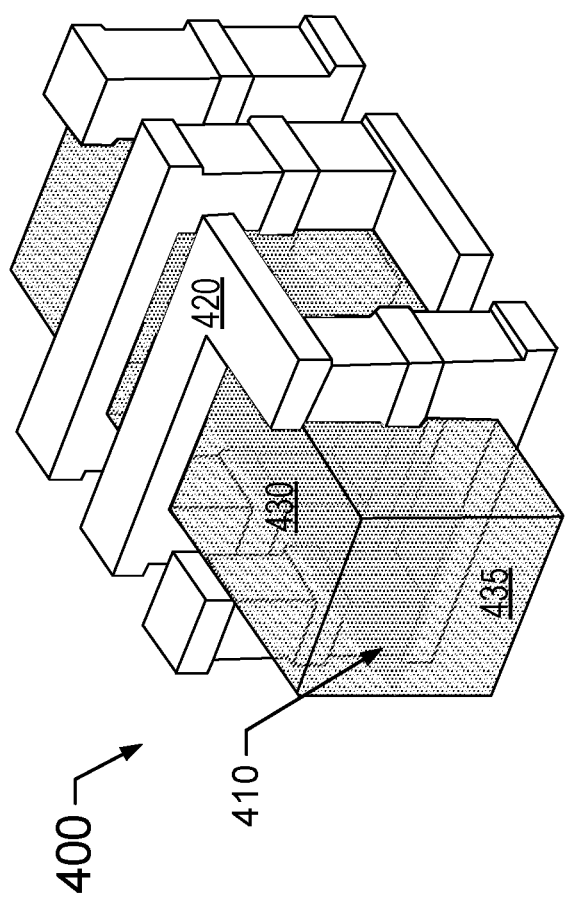
FIG. 5 is an isometric representation of the coil-type semiconductor device of FIG. 4.

FIG. 5 is an isometric representation of the coil-type semiconductor device 400 of FIG. 4 implementing an inductor, transformer, choke, etc. As shown in the example of FIG. 5, the semiconductor device 400 is formed with the conductive routing material 420 wrapped or coiled around the standoff substrates 430, 435, also surrounding the core of magnetic material 410. A standoff substrate is hidden from the view shown in FIG. 5 for the sake of clarity. In other examples, the magnetic material 410 can be formed both inside and outside the coil of conductive routing material 420.

Figure 6:
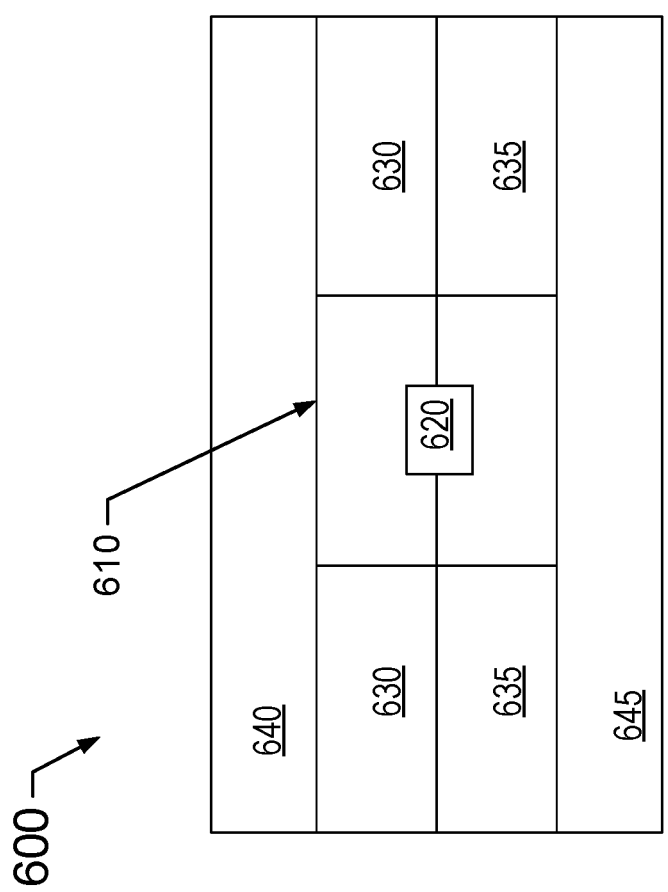
FIG. 6 is a cross section of an example magnetic structure including a magnetic material wrapping conductive routing in a split half standoff structure.
Figure 7:
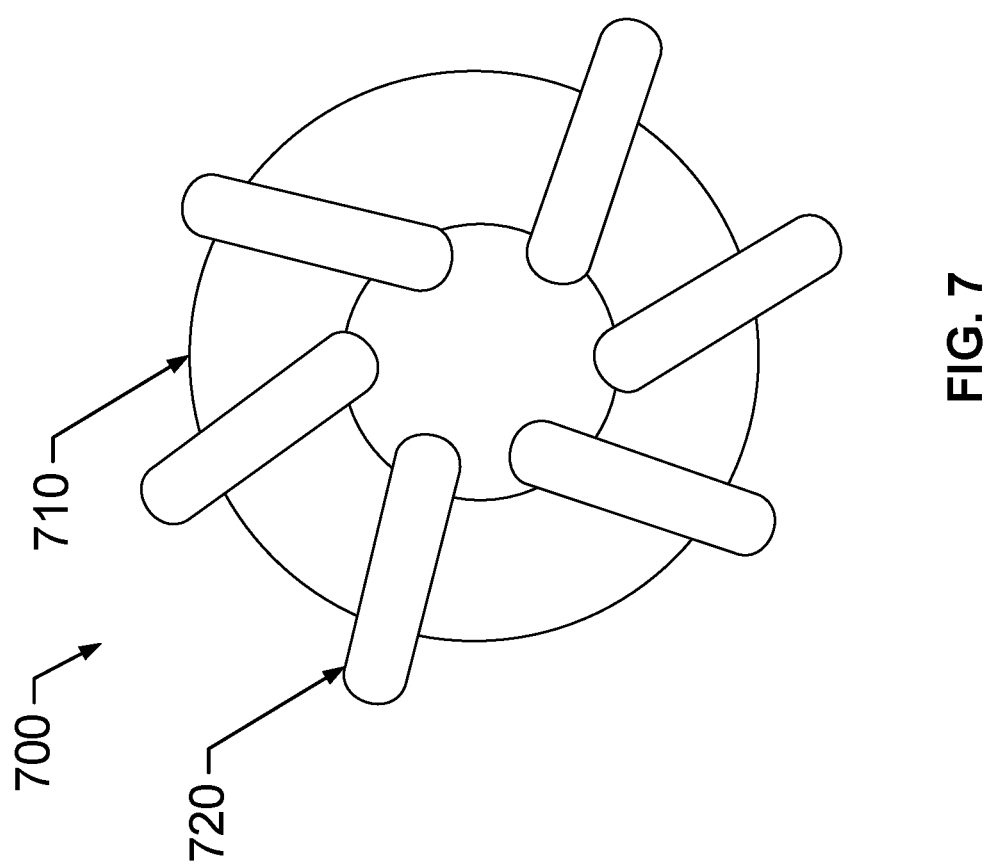
FIG. 7 is an example magnetic structure including a toroid of magnetic material wrapped with conductive routing to form a semiconductor device.

Alternatively or additionally to the examples shown in FIGS. 1-5, FIG. 6 is a cross section of an example magnetic structure 600 including a magnetic material 610 wrapping conductive routing 620 (e.g., a metal layer) in a split half standoff structure including standoff substrates 630, 635. The magnetic material 610 and standoff substrates 630, 635 are positioned between two silicon dies 640, 645. The example of FIG. 6 illustrates a linear, straight wire arrangement in which the magnetic material 610 surrounds the conductive routing 610, rather than vice versa. A linear conductor 620 is formed with magnetic material 610 surrounding the conductor 620. The combination forms a semiconductor device 600 implementing an inductor, transformer, etc.

Rather than a linear arrangement, as in the examples of FIGS. 4-6, FIG. 7 is a plan view of a toroid of magnetic material 710 wrapped with conductive routing 720 to form a semiconductor device 700 such as an inductor, transformer, choke, etc. The toroidal shape of the semiconductor device 700 of the example of FIG. 7 reduces an amount of magnetic flux that escapes the core 710 (e.g., a ferromagnetic material core 710, etc.) to provide improved efficiency and reduced electromagnetic interference (EMI). The toroidal inductor/transformer 700 can be used in a variety of electronic circuits including power supplies, inverters, amplifiers, etc., used in televisions, radios, computers, audio equipment, etc.

As disclosed and described above with respect to the examples of FIGS. 1-7, an inductor/transformer semiconductor device can be constructed in a variety of ways. The interaction between coil, core, and substrate forms an inductor, transformer, and/or other semiconductor device. Hybrid bonding enables spacing between silicon dies to be reduced (e.g., down to one micron, 5-10 microns, etc.) without creating conflicting magnetic fields, reducing the Q factor of the circuit, or weakening the magnetic fields of the resulting semiconductor device. Standoff substrates are used to provide improved interconnect between dies while increasing distance between the hybrid dies. In certain examples, metal-to-metal bonding surfaces (e.g., copper, etc.) expands to create a common part.

Increasing the distance to the lossy silicon substrate helps avoid a reduction in Q factor. As such, the standoff substrates can be thick (e.g., up to 400 um thick), which is not possible in traditional back end of line (BEOL) semiconductor processing with layers typically less than 10 um in thickness.

In certain examples, standoff substrates can be formed from a variety of materials including silicon dioxide ($SiO_2$), silicon carbon nitride (SiCN), silica (glass), ceramics (e.g., aluminum, etc.), organic material, etc. Conductive wires/routing can be formed using conductive metal such as copper, aluminum, gold, etc. In some examples, standoff substrates can vary in thickness from 20-30 microns. In other examples, standoff structures may vary 200-300 microns in thickness (with larger vias going through the standoffs). In certain examples, a process provides a 20-to-1 aspect ratio between standoff substrate thickness and size of via (e.g., 20 microns of via for 400 microns of standoff material). Other examples may be provide a 40-to-1 aspect ratio.

In certain examples, inductor/transformer semiconductor device (e.g., circuitry) is provided for power delivery, high performance inductors (e.g., for high speed input/output (I/O) circuitry, etc.), high frequency operation circuits (e.g., wireless communication such as 5G, 6G, etc.), etc. Circuitry with high Q factor requirements and space/size constraints can benefit from the hybrid bonding semiconductor devices disclosed herein.

While an example manner of implementing an inductor/transformer semiconductor device is illustrated in FIGS. 1-7, one or more of the elements, processes, and/or devices illustrated in FIGS. 1-7 may be combined, divided, re-arranged, omitted, eliminated, and/or implemented in any other way. The number, shape, and/or size of various elements may vary in other implementations. Some examples may include combinations of features depicted in FIGS. 1-7.

Figure 8:
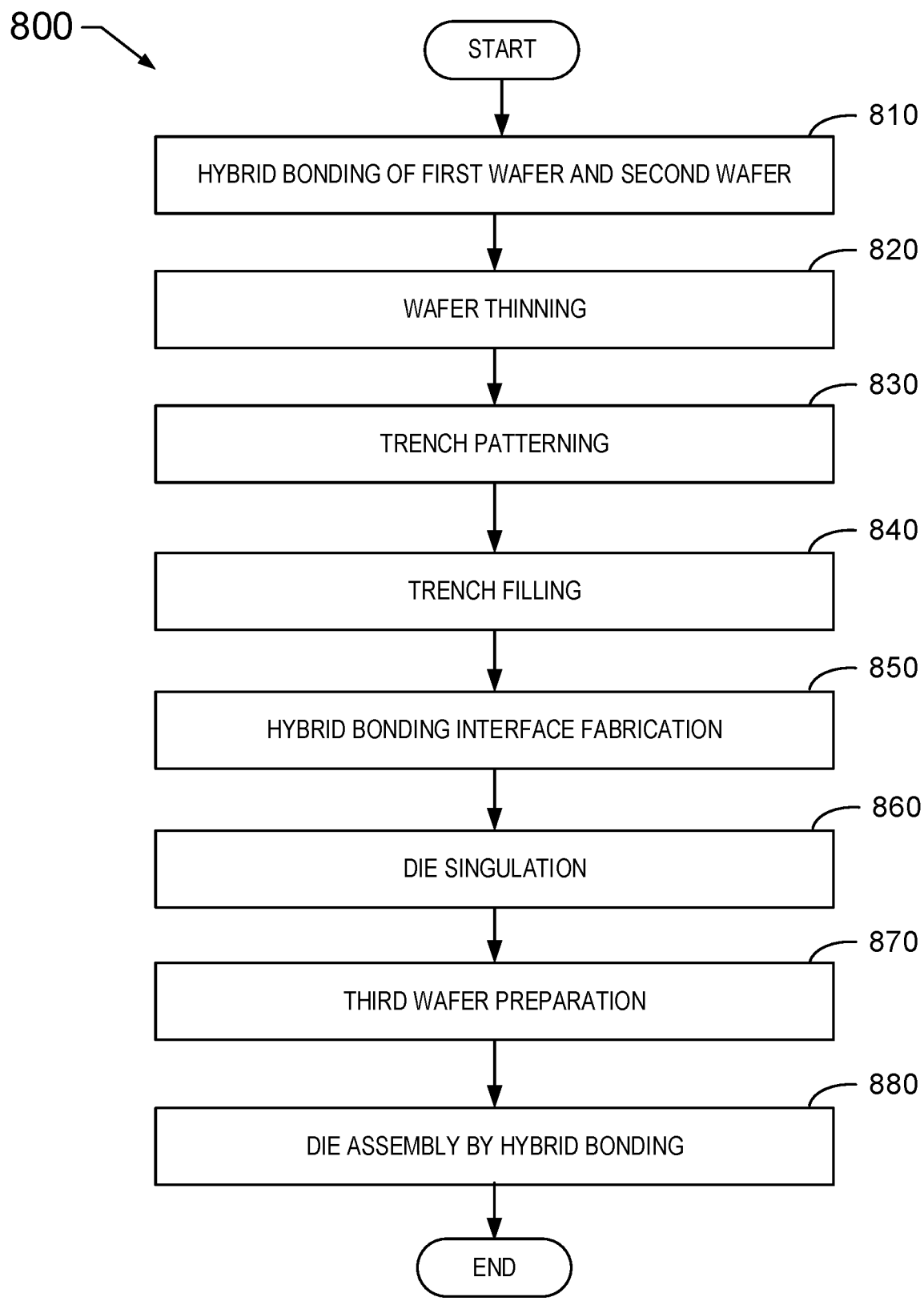
FIG. 8 is an example process to form one or more of the standoff substrate inductor/transformer semiconductor devices described above with respect to FIGS. 1-7.
Figure 9:
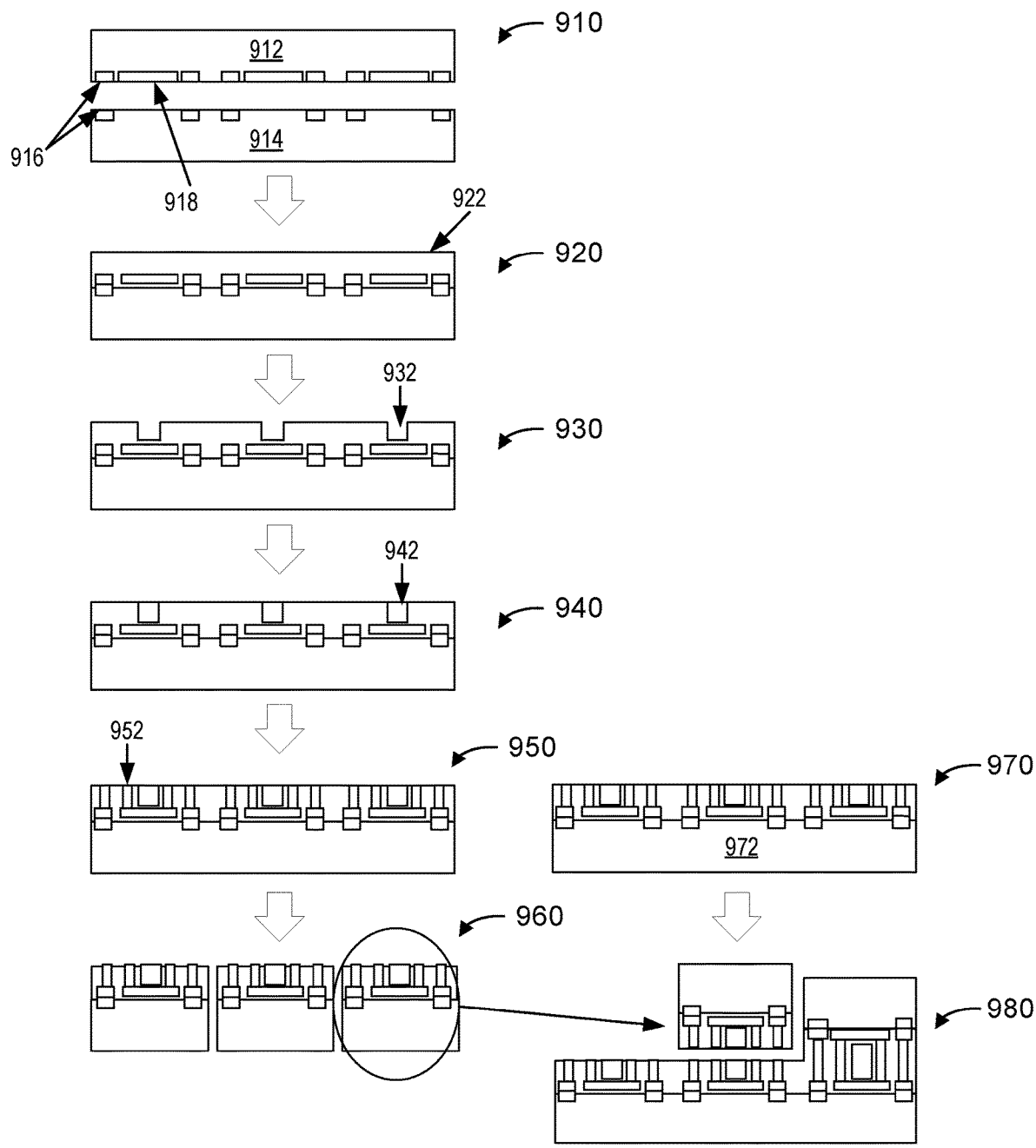
FIG. 9 is an example implementation of the process to form a half-split magnetic standoff substrate, such as the semiconductor device of FIG. 6.

A flowchart representative of example hardware logic circuitry, machine readable instructions, hardware implemented state machines, and/or any combination thereof for implementing the example semiconductor device(s) 100-700 FIGS. 1-7 is shown in FIGS. 8-9. The machine readable instructions may be one or more executable programs or portion(s) of an executable program for execution by processor circuitry, such as the processor circuitry 1012 shown in the example processor platform 1000 discussed below in connection with FIG. 10. The program may be embodied in software stored on one or more non-transitory computer readable storage media such as a CD, a floppy disk, a hard disk drive (HDD), a DVD, a Blu-ray disk, a volatile memory (e.g., Random Access Memory (RAM) of any type, etc.), or a non-volatile memory (e.g., FLASH memory, an HDD, etc.) associated with processor circuitry located in one or more hardware devices, but the entire program and/or parts thereof could alternatively be executed by one or more hardware devices other than the processor circuitry and/or embodied in firmware or dedicated hardware. The machine readable instructions may be distributed across multiple hardware devices and/or executed by two or more hardware devices (e.g., a server and a client hardware device). For example, the client hardware device may be implemented by an endpoint client hardware device (e.g., a hardware device associated with a user) or an intermediate client hardware device (e.g., a radio access network (RAN) gateway that may facilitate communication between a server and an endpoint client hardware device). Similarly, the non-transitory computer readable storage media may include one or more mediums located in one or more hardware devices. Further, although the example program is described with reference to the flowchart illustrated in FIG. 8 and/or the operations of FIG. 9, many other methods of implementing the example apparatus may alternatively be used. For example, the order of execution of the blocks may be changed, and/or some of the blocks described may be changed, eliminated, or combined. Additionally or alternatively, any or all of the blocks may be implemented by one or more hardware circuits (e.g., processor circuitry, discrete and/or integrated analog and/or digital circuitry, an FPGA, an ASIC, a comparator, an operational-amplifier (op-amp), a logic circuit, etc.) structured to perform the corresponding operation without executing software or firmware. The processor circuitry may be distributed in different network locations and/or local to one or more hardware devices (e.g., a single-core processor (e.g., a single core central processor unit (CPU)), a multi-core processor (e.g., a multi-core CPU), etc.) in a single machine, multiple processors distributed across multiple servers of a server rack, multiple processors distributed across one or more server racks, a CPU and/or a FPGA located in the same package (e.g., the same integrated circuit (IC) package or in two or more separate housings, etc.).

The machine readable instructions described herein may be stored in one or more of a compressed format, an encrypted format, a fragmented format, a compiled format, an executable format, a packaged format, etc. Machine readable instructions as described herein may be stored as data or a data structure (e.g., as portions of instructions, code, representations of code, etc.) that may be utilized to create, manufacture, and/or produce machine executable instructions. For example, the machine readable instructions may be fragmented and stored on one or more storage devices and/or computing devices (e.g., servers) located at the same or different locations of a network or collection of networks (e.g., in the cloud, in edge devices, etc.). The machine readable instructions may require one or more of installation, modification, adaptation, updating, combining, supplementing, configuring, decryption, decompression, unpacking, distribution, reassignment, compilation, etc., in order to make them directly readable, interpretable, and/or executable by a computing device and/or other machine. For example, the machine readable instructions may be stored in multiple parts, which are individually compressed, encrypted, and/or stored on separate computing devices, wherein the parts when decrypted, decompressed, and/or combined form a set of machine executable instructions that implement one or more operations that may together form a program such as that described herein.

In another example, the machine readable instructions may be stored in a state in which they may be read by processor circuitry, but require addition of a library (e.g., a dynamic link library (DLL)), a software development kit (SDK), an application programming interface (API), etc., in order to execute the machine readable instructions on a particular computing device or other device. In another example, the machine readable instructions may need to be configured (e.g., settings stored, data input, network addresses recorded, etc.) before the machine readable instructions and/or the corresponding program(s) can be executed in whole or in part. Thus, machine readable media, as used herein, may include machine readable instructions and/or program(s) regardless of the particular format or state of the machine readable instructions and/or program(s) when stored or otherwise at rest or in transit.

The machine readable instructions described herein can be represented by any past, present, or future instruction language, scripting language, programming language, etc. For example, the machine readable instructions may be represented using any of the following languages: C, C++, Java, C#, Perl, Python, JavaScript, HyperText Markup Language (HTML), Structured Query Language (SQL), Swift, etc.

As mentioned above, the example operations of FIGS. 8-9 may be implemented using executable instructions (e.g., computer and/or machine readable instructions) stored on one or more non-transitory computer and/or machine readable media such as optical storage devices, magnetic storage devices, an HDD, a flash memory, a read-only memory (ROM), a CD, a DVD, a cache, a RAM of any type, a register, and/or any other storage device or storage disk in which information is stored for any duration (e.g., for extended time periods, permanently, for brief instances, for temporarily buffering, and/or for caching of the information). As used herein, the terms non-transitory computer readable medium and non-transitory computer readable storage medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements or method actions may be implemented by, e.g., the same entity or object. Additionally, although individual features may be included in different examples or claims, these may possibly be combined, and the inclusion in different examples or claims does not imply that a combination of features is not feasible and/or advantageous.

In certain examples, an apparatus includes magnetic material means, first standoff substrate means, second standoff substrate means, and conductive layer means. The magnetic material means can be implemented using one or more of the magnetic material 410, the magnetic material 610, or the magnetic material 710. The first standoff substrate means can be implemented using one or more of the standoff substrate 110, the standoff substrate 210, the standoff substrate 310-315, the standoff substrate 430-435, or the standoff substrate 630-635. The second standoff substrate means can be implemented using one or more of the standoff substrate 110, the standoff substrate 210, the standoff substrate 310-315, the standoff substrate 430-435, or the standoff substrate 630-635. The conductive layer means can be implemented using one or more of the top metal layer 140, the metal layer 220, the underpass 320, the conductive routing 420, the linear conductor 620, or the conductive routing 720.

FIG. 8 is an example process 800 to form one or more of the standoff substrate inductor/transformer semiconductor devices described above with respect to FIGS. 1-7. The example process 800 can be executed by the example processor circuitry 1012 as described above to deposit and remove material to form the example semiconductor device(s) 100-700.

At block 810, hybrid bonding is applied to interconnect first and second wafers to form a composite wafer. For example, hybrid bonding is used to join a chip wafer with a standoff wafer. Instead of copper bumps, hybrid bonding forms a direct bond between dielectrics and metal (e.g., copper, aluminum, gold, etc.). Hybrid bonding can connect two wafers, a die to a wafer, etc. Layers are bonded metal-to-metal via bonding surfaces. For example, copper can be placed as a bonding layer on each wafer to be bonded, and the thermo-compressed copper expands to create a common part (e.g., 1 micron on top and bottom to form a composite 2-micron interconnect layer). RDL and/or other buried structures can be included in a dielectric and will not bond with the metal. Several interconnect layers can be provided in a wafer, with the last layer as the hybrid bonding layer to bond with the corresponding layer on the other wafer, for example. As such a composite interconnect layer is formed (e.g., interconnect pitch 1-9 microns, etc.).

At block 820, one of the wafers (e.g., the top wafer or standoff wafer) forming the composite wafer is thinned. For example, part of the dielectric (e.g., glass, alumina, ceramic, high resistivity or other silicon, etc.) of the wafer is etched to thin the wafer to a desired thickness. At block 830, a trench is then formed or patterned by etching the dielectric. RDL and/or other buried structure can be exposed by etching the trench, for example. At block 840, the trench is filled with a magnetic material (e.g., iron, ferromagnetic material, ferrimagnetic material, etc.). The material is grinded and/or polished to become flush or even with the rest of the wafer surface. For example, chemical mechanical polishing (CMP) is applied to flatten and smooth the surface.

At block 850, a hybrid bond interface is fabricated. For example, hybrid bond interface fabrication combines a dielectric with embedded metal pads to form interconnections. For example, copper pads that are co-planar (or substantially co-planar with a degree of variation or deposition error) with the die surface are formed by depositing metal (e.g., copper, etc.) around the magnetic trenches. A second interface can be created on a planar composite wafer to create standoff substrates forming one or more hybrid bonding interfaces, for example.

At block 860, die singulation or separation of the composite wafer into one or more dies can be performed. In certain examples, the composite wafer is kept as a single piece. In other examples, the composite wafer is diced or cut into multiple die. Wafer dicing separates individual dies on a wafer for further packaging and assembly.

At block 870, a third wafer (e.g., a base wafer) is prepared in mirror image according to the process of blocks 810-860. For example, a base wafer is prepared as the composite wafer has been prepared, and the base wafer is positioned for interconnection to the composite wafer. At block 880, one or more dies are assembled by hybrid bonding. For example, the composite wafer and the third wafer are brough into contact to form a bond between dielectric interfaces of the two wafers. Heat is applied to connect the hybrid bond interfaces of each wafer. The heat causes the metal of the bond interfaces (e.g., copper, aluminum, gold, etc.) to expand and contact each other to form electrical connections. Dielectric-to-dielectric bonds are also strengthened from the heat. The heat is maintained to allow the contacted metal pads to inter-diffuse and form a permanent metal bond that is maintained after the heat is removed and the dies cool down. A resulting semiconductor device, such as the example inductor/transformer semiconductor device 100-700 is generated. In some examples, multiple dies can be diced and generated via the example process 800 of FIG. 8.

In certain examples, vias are formed to connect hybrid bonding pads. Vias can be deposited to connect the die(s) to other circuitry, components, etc. In certain examples, the process 800 can be repeated to create additional top and/or bottom wafers to combine, dice, fuse, etc., to form various semiconductor circuits or devices.

While FIG. 8 illustrates one way to form the example semiconductor devices, many other ways exist to construct inductor/transformer/choke semiconductor devices. As such, a variety of techniques can provide the resulting structure—a semiconductor device used alone or in combination with other circuitry to form an inductor, transformer, choke, etc.

Wafers can be combined as described above with respect to FIG. 8, resulting in assemblies generated using the wafers to form the semiconductor device(s). As such, wafers used in the manufacture of a semiconductor device are assemblies in the semiconductor device. For example, a first standoff substrate and a first portion of magnetic material provide a first assembly, and a second standoff substrate and a second portion of magnetic material provide a second assembly. The first assembly is hybrid bonded to the second assembly to provide the semiconductor device. In certain examples, the first assembly includes a chiplet or tile and a standoff substrate, and the second assembly is a base assembly.

FIG. 9 is an example implementation 900 of the process 800 to form a half-split magnetic standoff substrate such as the semiconductor device 600 of FIG. 6. At 910, a standoff wafer 912 and a chiplet wafer 914 (a chiplet can also be referred to as a tile) are interconnected. Each wafer 912, 914 includes a plurality of hybrid bond interfaces 916 to engage under thermo-pressure to form a common interconnect. The standoff wafer also includes an RDL layer 918 that does not bond with the hybrid bond interfaces 916, for example.

At block 920, the standoff wafer 912 is thinned. For example, a portion of dielectric 922 forming the standoff wafer 912 is etched, grinded, and/or otherwise removes to thin the standoff wafer 912. At block 930, trenches 932 are formed or patterned by etching the dielectric 922 of the standoff wafer 912. Etching of the trenches 932 exposes the RDL layer 918 and/or other buried structure. At block 940, the trenches 932 are filled with a magnetic material 942. The magnetic material 942 is ground and/or polished to become flush or even with the rest of the standoff wafer surface 912. For example, chemical mechanical polishing (CMP) is applied to flatten and smooth the magnetic material 942 to be even with the standoff wafer surface 912.

At block 950, hybrid bond interfaces 952 formed around the magnetic material 942. For example, metal (e.g., copper, aluminum, gold, alloy, etc.) is deposited or otherwise embedded in the dielectric 922 of the standoff wafer 912 to contact the hybrid bond interfaces 916 (e.g., metal pads) embedded in the wafer 912.

At block 960, die singulation or separation of the composite wafer into one or more dies can be performed. At block 970, a base wafer 972 is prepared similar to the composite wafer of standoff 912 and chiplet or tile 914. At block 980, one or more dies are assembled by hybrid bonding. For example, the two wafers are brough into contact to form a bond between dielectric interfaces of the two wafers. Heat is applied to connect the hybrid bond interfaces of each wafer. The heat causes the metal of the bond interfaces (e.g., copper, aluminum, gold, etc.) to expand and contact each other to form electrical connections. Dielectric-to-dielectric bonds are also strengthened from the heat. The heat is maintained to allow the contacted metal pads to inter-diffuse and form a permanent metal bond that is maintained after the heat is removed and the dies cool down. One or more semiconductor devices 600 are then generated.

Figure 10:
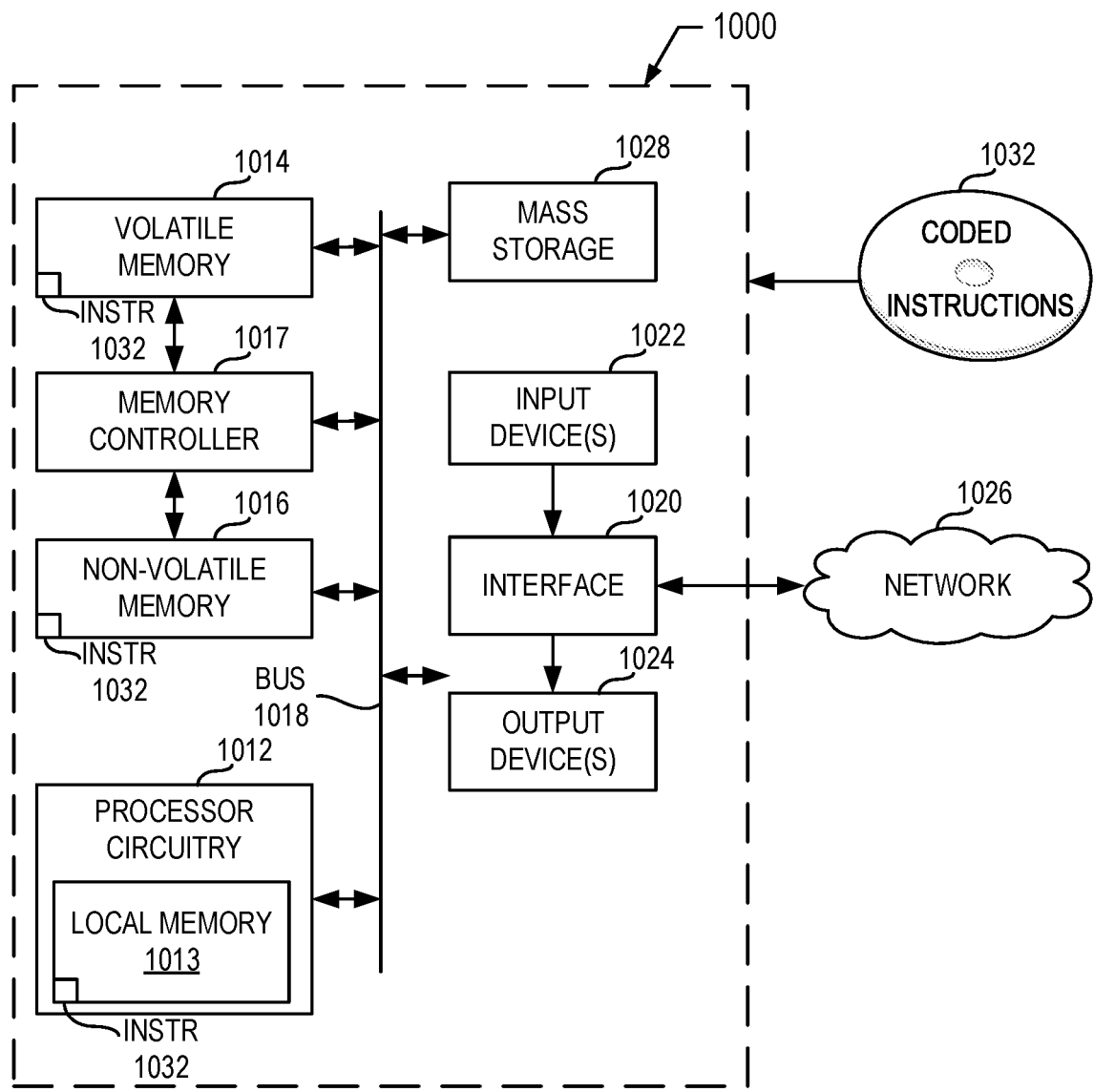
FIG. 10 is a block diagram of an example processor platform structured to execute and/or instantiate the machine-readable instructions and/or operations of FIGS. 8 and/or 9 to implement the example semiconductor devices of FIGS. 1-7.

FIG. 10 is a block diagram of an example processor platform 1000 structured to execute and/or instantiate the machine-readable instructions and/or operations of FIGS. 8 and/or 9 to implement the example apparatus and/or articles of manufacture 100-700 of FIGS. 1-7. The processor platform 1000 can be, for example, a semiconductor fabrication device, a wafer/die production controller, a wafer producing/processing device, a die/wafer etching device, a server, a personal computer, a self-learning machine (e.g., a neural network), a mobile device (e.g., a cell phone, a smart phone, a tablet such as an iPad¹), an Internet appliance, or any other type of computing device.

The processor platform 1000 of the illustrated example includes processor circuitry 1012. The processor circuitry 1012 of the illustrated example is hardware. For example, the processor circuitry 1012 can be implemented by one or more integrated circuits, logic circuits, FPGAs, microprocessors, CPUs, GPUs, DSPs, and/or microcontrollers from any desired family or manufacturer. The processor circuitry 1012 may be implemented by one or more semiconductor based (e.g., silicon based) devices. In this example, the processor circuitry 1012 controls fabrication equipment to implement the example semiconductor device(s) 100-700.

The processor circuitry 1012 of the illustrated example includes a local memory 1013 (e.g., a cache, registers, etc.). The processor circuitry 1012 of the illustrated example is in communication with a main memory including a volatile memory 1014 and a non-volatile memory 1016 by a bus 1018. The volatile memory 1014 may be implemented by Synchronous Dynamic Random Access Memory (SDRAM), Dynamic Random Access Memory (DRAM), RAMBUS® Dynamic Random Access Memory (RDRAM®), and/or any other type of RAM device. The non-volatile memory 1016 may be implemented by flash memory and/or any other desired type of memory device. Access to the main memory 1014, 1016 of the illustrated example is controlled by a memory controller 1017.

The processor platform 1000 of the illustrated example also includes interface circuitry 1020. The interface circuitry 1020 may be implemented by hardware in accordance with any type of interface standard, such as an Ethernet interface, a universal serial bus (USB) interface, a Bluetooth® interface, a near field communication (NFC) interface, a PCI interface, and/or a PCIe interface.

In the illustrated example, one or more input devices 1022 are connected to the interface circuitry 1020. The input device(s) 1022 permit(s) a user to enter data and/or commands into the processor circuitry 1012. The input device(s) 1022 can be implemented by, for example, an audio sensor, a microphone, a camera (still or video), a keyboard, a button, a mouse, a touchscreen, a track-pad, a trackball, an isopoint device, and/or a voice recognition system.

One or more output devices 1024 are also connected to the interface circuitry 1020 of the illustrated example. The output devices 1024 can be implemented, for example, by display devices (e.g., a light emitting diode (LED), an organic light emitting diode (OLED), a liquid crystal display (LCD), a cathode ray tube (CRT) display, an in-place switching (IPS) display, a touchscreen, etc.), a tactile output device, a printer, and/or speaker. The interface circuitry 1020 of the illustrated example, thus, typically includes a graphics driver card, a graphics driver chip, and/or graphics processor circuitry such as a GPU.

The interface circuitry 1020 of the illustrated example also includes a communication device such as a transmitter, a receiver, a transceiver, a modem, a residential gateway, a wireless access point, and/or a network interface to facilitate exchange of data with external machines (e.g., computing devices of any kind) by a network 1026. The communication can be by, for example, an Ethernet connection, a digital subscriber line (DSL) connection, a telephone line connection, a coaxial cable system, a satellite system, a line-of-site wireless system, a cellular telephone system, an optical connection, etc.

The processor platform 1000 of the illustrated example also includes one or more mass storage devices 1028 to store software and/or data. Examples of such mass storage devices 1028 include magnetic storage devices, optical storage devices, floppy disk drives, HDDs, CDs, Blu-ray disk drives, redundant array of independent disks (RAID) systems, solid state storage devices such as flash memory devices, and DVD drives.

The machine executable instructions 1032, which may be implemented by the machine readable instructions of FIG. 8, may be stored in the mass storage device 1028, in the volatile memory 1014, in the non-volatile memory 1016, and/or on a removable non-transitory computer readable storage medium such as a CD or DVD.

Figure 11:
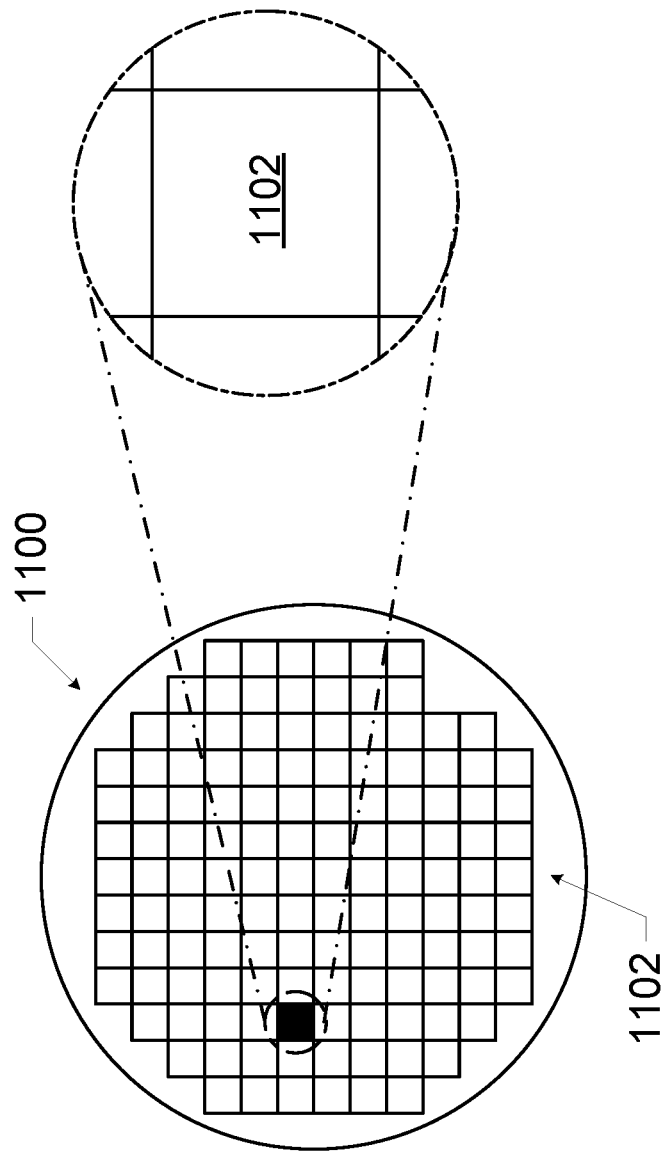
FIG. 11-12 illustrate various examples of apparatuses that may include any of the devices of FIGS. 1-7 disclosed herein.
Figure 12:
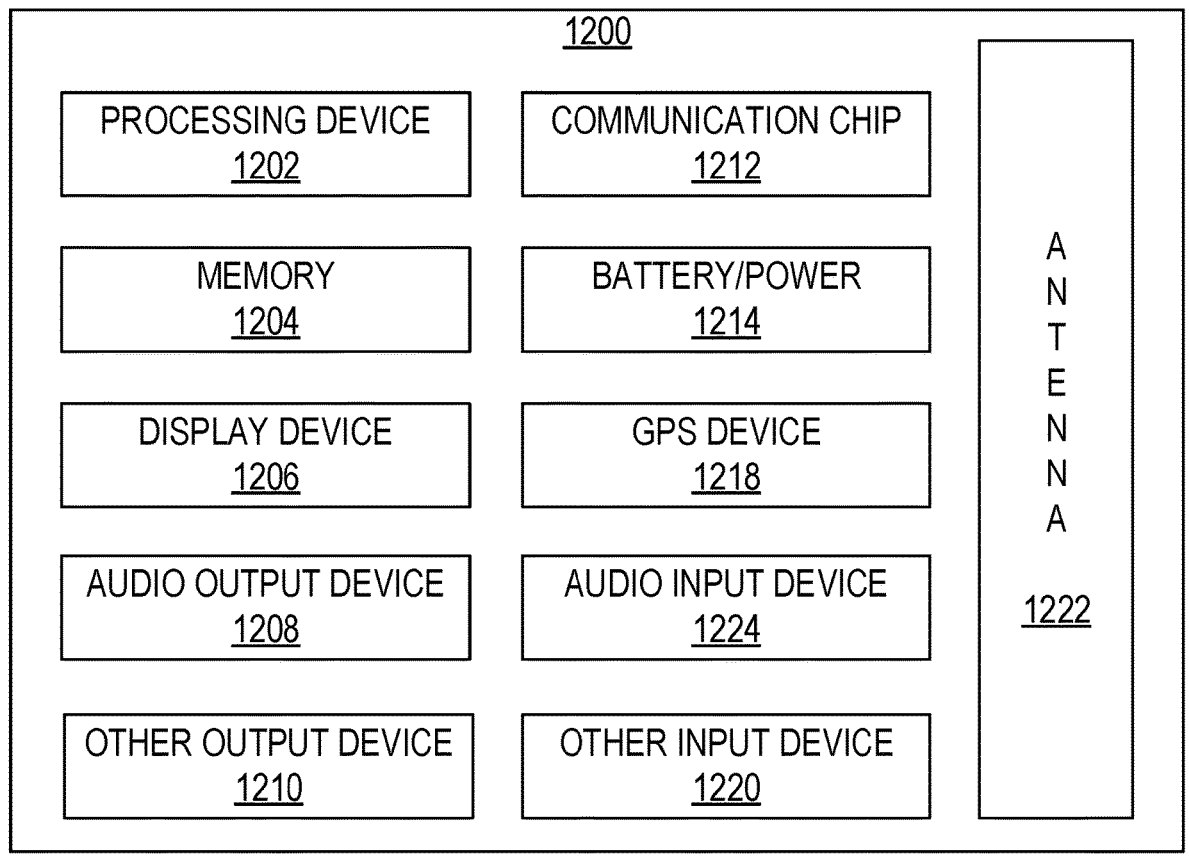

The semiconductor logic devices 100-700 disclosed herein may be included in any suitable electronic component. FIG. 11-12 illustrate various examples of apparatuses that may include any of the devices 100-700 disclosed herein.

FIG. 11 is a top view of a wafer 1100 and dies 1102 that may include one or more semiconductor devices 100-700, or may be included in an integrated circuit (IC) package whose substrate includes one or more devices 100-700 in accordance with any of the examples disclosed herein. The wafer 1100 may be composed of semiconductor material and may include one or more dies 1102 having IC structures formed on a surface of the wafer 1100. Each of the dies 1102 may be a repeating unit of a semiconductor product that includes any suitable IC. After the fabrication of the semiconductor product is complete, the wafer 1100 may undergo a singulation process in which the dies 1102 are separated from one another to provide discrete "chips" of the semiconductor product. The die 1102 may include one or more semiconductor devices 100-700 (e.g., implementing one or more inductors, transformers, and/or chokes, etc.) and/or supporting circuitry to route electrical signals to the semiconductor device 100-700, as well as any other IC components. In some examples, the wafer 1100 or the die 1102 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1102. For example, a memory array formed by multiple memory devices may be formed on a same die 1102 as a processing device or other logic that is configured to store information in the memory devices or execute instructions stored in the memory array.

FIG. 12 is a block diagram of an example electrical device 1200 that may include one or more semiconductor devices 100-700, in accordance with any of the examples disclosed herein. For example, any suitable ones of the components of the electrical device 1200 may include one or more of the IC packages, IC devices, or dies 1102 disclosed herein. A number of components are illustrated in FIG. 12 as included in the electrical device 1200, but any one or more of these components may be omitted or duplicated, as suitable for the application. In some examples, some or all of the components included in the electrical device 1200 may be attached to one or more motherboards. In some examples, some or all of these components are fabricated onto a single system-on-a-chip (SoC) die.

Additionally, in various examples, the electrical device 1200 may not include one or more of the components illustrated in FIG. 12, but the electrical device 1200 may include interface circuitry for coupling to the one or more components. For example, the electrical device 1200 may not include a display device 1206, but may include display device interface circuitry (e.g., a connector and driver circuitry) to which a display device 1206 may be coupled. In another set of examples, the electrical device 1200 may not include an audio input device 1224 or an audio output device 1208 but may include audio input or output device interface circuitry (e.g., connectors and supporting circuitry) to which an audio input device 1224 or audio output device 1208 may be coupled.

The electrical device 1200 may include a processing device 1202 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1202 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1200 may include a memory 1204, which may itself include one or more memory devices such as volatile memory (e.g., dynamic random access memory (DRAM)), nonvolatile memory (e.g., read-only memory (ROM)), flash memory, solid state memory, and/or a hard drive. In some examples, the memory 1204 may include memory that shares a die with the processing device 1202. This memory may be used as cache memory and may include embedded dynamic random access memory (eDRAM) or spin transfer torque magnetic random access memory (STT-MRAM).

In some examples, the electrical device 1200 may include a communication chip 1212 (e.g., one or more communication chips). For example, the communication chip 1212 may be configured for managing wireless communications for the transfer of data to and from the electrical device 1200. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some examples they might not.

The communication chip 1212 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1212 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1212 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1212 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1212 may operate in accordance with other wireless protocols in other examples. The electrical device 1200 may include an antenna 1222 to facilitate wireless communications and/or to receive other wireless communications (such as AM or FM radio transmissions).

In some examples, the communication chip 1212 may manage wired communications, such as electrical, optical, or any other suitable communication protocols (e.g., the Ethernet). As noted above, the communication chip 1212 may include multiple communication chips. For instance, a first communication chip 1212 may be dedicated to shorter-range wireless communications such as Wi-Fi or Bluetooth, and a second communication chip 1212 may be dedicated to longer-range wireless communications such as global positioning system (GPS), EDGE, GPRS, CDMA, WiMAX, LTE, EV-DO, or others. In some examples, a first communication chip 1212 may be dedicated to wireless communications, and a second communication chip 1212 may be dedicated to wired communications.

The electrical device 1200 may include battery/power circuitry 1214. The battery/power circuitry 1214 may include one or more energy storage devices (e.g., batteries or capacitors) and/or circuitry for coupling components of the electrical device 1200 to an energy source separate from the electrical device 1200 (e.g., AC line power).

The electrical device 1200 may include a display device 1206 (or corresponding interface circuitry, as discussed above). The display device 1206 may include any visual indicators, such as a heads-up display, a computer monitor, a projector, a touchscreen display, a liquid crystal display (LCD), a light-emitting diode display, or a flat panel display.

The electrical device 1200 may include an audio output device 1208 (or corresponding interface circuitry, as discussed above). The audio output device 1208 may include any device that generates an audible indicator, such as speakers, headsets, or earbuds.

The electrical device 1200 may include an audio input device 1224 (or corresponding interface circuitry, as discussed above). The audio input device 1224 may include any device that generates a signal representative of a sound, such as microphones, microphone arrays, or digital instruments (e.g., instruments having a musical instrument digital interface (MIDI) output).

The electrical device 1200 may include a GPS device 1218 (or corresponding interface circuitry, as discussed above). The GPS device 1218 may be in communication with a satellite-based system and may receive a location of the electrical device 1200, as known in the art.

The electrical device 1200 may include another output device 1210 (or corresponding interface circuitry, as discussed above). Examples of the other output device 1210 may include an audio codec, a video codec, a printer, a wired or wireless transmitter for providing information to other devices, or an additional storage device.

The electrical device 1200 may include another input device 1220 (or corresponding interface circuitry, as discussed above). Examples of the other input device 1220 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1200 may have any desired form factor, such as a hand-held or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server or other networked computing component, a printer, a scanner, a monitor, a set-top box, an entertainment control unit, a vehicle control unit, a digital camera, a digital video recorder, or a wearable electrical device. In some examples, the electrical device 1200 may be any other electronic device that processes data.

From the foregoing, it will be appreciated that example systems, methods, apparatus, and articles of manufacture have been disclosed that provide hybrid-bonded semiconductor devices. The disclosed systems, methods, apparatus, and articles of manufacture improve the efficiency and effectiveness of such semiconductor devices by enabling smaller footprints and closer positioning of components through hybrid bonding. The disclosed systems, methods, apparatus, and articles of manufacture are accordingly directed to one or more improvement(s) in the design and manufacture of circuitry such as inductors, transformers, etc., using the improved semiconductor devices.

The following paragraphs provide various examples of the implementations disclosed herein.

Example 1 is a semiconductor device including: a magnetic material; a first standoff substrate and a second standoff substrate adjacent the magnetic material, the first standoff substrate adjacent the second standoff substrate; and a conductive layer adjacent the magnetic material.

Example 2 is the semiconductor device of example 1, wherein the first standoff substrate and the second standoff substrate surround the magnetic material.

Example 3 is the semiconductor device of example 1, wherein the conductive layer extends around the magnetic material.

Example 4 is the semiconductor device of example 1, wherein the conductive layer extends through the magnetic material.

Example 5 is the semiconductor device of example 1, wherein the magnetic material and the conductive layer include a toroid.

Example 6 is the semiconductor device of example 1, wherein the magnetic material and the conductive layer include at least one of an inductor or a transformer.

Example 7 is the semiconductor device of example 1, wherein the conductive layer includes copper.

Example 8 is the semiconductor device of example 1, wherein the first standoff substrate and a first portion of the magnetic material include a first assembly and the second standoff substrate and a second portion of the magnetic material assembly a second wafer, and wherein the first assembly is hybrid bonded to the second assembly.

Example 9 is the semiconductor device of example 1, wherein the first assembly includes a chiplet or tile and a standoff assembly, and wherein the second assembly is a base assembly.

Example 10 is a method of producing a semiconductor device, the method including: providing a first wafer, the first wafer including magnetic material, a standoff substrate, and a conductive layer; fabricating a first hybrid bonding interface on the first wafer; providing a second wafer including a second hybrid bonding interface; and assembling the semiconductor device by interconnecting the first hybrid bonding interface and the second hybrid bonding interface.

Example 11 is the method of example 10, wherein the first wafer is formed of a chiplet wafer and a standoff wafer, and wherein the second wafer is a base wafer, the method further including thinning the standoff wafer.

Example 12 is the method of example 10, further including patterning a trench in the first wafer; and filling the trench with the magnetic material.

Example 13 is the method of example 12, further including at least one of grinding or polishing the magnetic material in the trench.

Example 14 is the method of example 10, further including dicing the first wafer into a plurality of die.

Example 15 is the method of example 14, wherein assembling the semiconductor device by interconnecting the first hybrid bonding interface and the second hybrid bonding interface further includes assembling a plurality of semiconductor devices using the plurality of die.

Example 16 is a system including: a processing device including: a communications chip; and a semiconductor device including: magnetic material; a first standoff substrate and a second standoff substrate adjacent the magnetic material, the first standoff substrate adjacent the second standoff substrate; and a conductive layer adjacent the magnetic material.

Example 17 is the system of example 16, wherein the first standoff substrate and the second standoff substrate surround the magnetic material.

Example 18 is the system of example 16, wherein the conductive layer extends at least one of i) around the magnetic material or ii) through the magnetic material.

Example 19 is the system of example 16, wherein the semiconductor device is at least one of an inductor or a transformer.

Example 20 is the system of example 16, wherein the first standoff substrate and a first portion of the magnetic material include a first assembly and the second standoff substrate and a second portion of the magnetic material include a second assembly, and wherein the first assembly is hybrid bonded to the second assembly.

Example 21 is an apparatus including: magnetic material means; first standoff substrate means; second standoff substrate means; and conductive layer means.

Example 22 is a semiconductor device including: a base layer a standoff substrate positioned on the base layer; and a conductive layer positioned on the standoff substrate to form at least one of an inductor or a transformer.

Example 23 is the semiconductor device of example 22, wherein the standoff substrate includes a first standoff substrate and a second standoff substrate.

Example 24 is the semiconductor device of example 23, further including a magnetic material, the first standoff substrate and the second standoff substrate adjacent the magnetic material, the first standoff substrate adjacent the second standoff substrate.

Example 25 is the semiconductor device of example 24, wherein the conductive layer extends around the magnetic material.

Example 26 is the semiconductor device of example 24, wherein the conductive layer extends through the magnetic material.

Example 27 is the semiconductor device of example 24, wherein the magnetic material and the conductive layer include a toroid.

Example 28 is the semiconductor device of example 24, wherein the first standoff substrate and a first portion of the magnetic material include a first assembly and the second standoff substrate and a second portion of the magnetic material include a second assembly, and wherein the first assembly is hybrid bonded to the second assembly.

Example 29 is the semiconductor device of example 28, wherein the first assembly includes a chiplet or tile and a standoff wafer, and wherein the second assembly is a base assembly.

Example 30 is the semiconductor device of any of examples 22-29, wherein the conductive layer includes an underpass.

Example 31 is the semiconductor device of any of examples 22-29, wherein the standoff substrate is formed of at least one of silica, ceramic, silicon dioxide, or silicon carbon nitride.

Example 32 is the semiconductor device of any of examples 22-29, wherein the conductive layer includes copper.

Example 33 is a semiconductor device including: a first silicon die; a conductive layer; a magnetic material; a substrate; and a second silicon die.

Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the examples of this patent. Although the examples disclosed herein have been shown in examples related to semiconductors and/or microprocessors, the examples disclosed herein may be applied to any other appropriate interconnect (e.g., a layered interconnect) application(s) or etching processes in general.

What is claimed is:

1. A semiconductor device comprising:
a first silicon die including a first base semiconductor substrate and a first back-end stack, the first silicon die including a first backend layer having a first thickness that is between 0.1 and 5 micrometers;
a second silicon die including a second base semiconductor substrate and a second back-end stack, the second silicon die including a second backend layer having a second thickness that is between 0.1 and 5 micrometers;
a first standoff substrate having a first outer surface and a second outer surface opposite the first outer surface, the first standoff substrate between the first silicon die and the second silicon die, the first standoff substrate physically separate from the first silicon die, the first outer surface of the first standoff substrate in direct contact with a surface of the first silicon die via a first hybrid bond coupling, the first standoff substrate including a first single layer of material including at least one of a polymer, alumina, or aluminum nitride, the first single layer of material having a second thickness that is between 5 and 400 micrometers;
a second standoff substrate having a third outer surface and a fourth outer surface opposite the third outer surface, the second standoff substrate between the first standoff substrate and the second silicon die, the second standoff substrate physically separate from the second silicon die, the fourth outer surface of the second standoff substrate in direct contact with a surface of the second silicon die via a second hybrid bond coupling, the second standoff substrate including a second single layer of material including at least one of a polymer, alumina, or aluminum nitride, the first single layer of material having a fourth thickness that is between 5 and 400 micrometers;

a magnetic material, the magnetic material adjacent the first standoff substrate and the second standoff substrate; and a conductive layer adjacent at least one of the first standoff substrate or the second standoff substrate.

2. The semiconductor device of claim 1, wherein the first standoff substrate and the second standoff substrate surround the magnetic material.

3. The semiconductor device of claim 2, wherein the conductive layer extends around the magnetic material.

4. The semiconductor device of claim 2, wherein the conductive layer extends through the magnetic material.

5. The semiconductor device of claim 2, wherein the magnetic material and the conductive layer include a toroid.

6. The semiconductor device of claim 2, wherein the magnetic material and the conductive layer implement at least one of an inductor or a transformer.

7. The semiconductor device of claim 1, wherein the conductive layer includes copper.

8. The semiconductor device of claim 1, wherein the first standoff substrate includes a first assembly and the second standoff substrate includes a second assembly, the first assembly including a chiplet or tile, and wherein the second assembly is a base assembly.

9. A system comprising:
a processing device including:
a communications chip operable according to at least one of a 5G or 6G communication protocol; and
a semiconductor device including:
magnetic material;
a first standoff substrate and a second standoff substrate adjacent the magnetic material, the first standoff substrate connected to the second standoff substrate via a first hybrid bond coupling;
a conductive layer adjacent the magnetic material;
a first silicon die including a first base semiconductor substrate and a first back-end stack, the first silicon die connected to the first standoff substrate via a second hybrid bond coupling, the first standoff substrate between the first silicon die and the second standoff substrate, the first silicon die including a first backend layer having a first thickness that is between 0.1 and 5 micrometers, the first standoff substrate including at least one of a polymer, alumina, or aluminum nitride and having a second thickness that is between 5 and 400 micrometers; and
a second silicon die including a second base semiconductor substrate and a second back-end stack, the second silicon die connected to the second standoff substrate via a third hybrid bond coupling, the second standoff substrate between the second silicon die and the first standoff substrate, the second silicon die including a second backend layer having a third thickness that is between 0.1 and 5 micrometers, the second standoff substrate including at least one of a polymer, alumina, or aluminum nitride and having a fourth thickness that is between 5 and 400 micrometers.

10. The system of claim 9, wherein the first standoff substrate and the second standoff substrate surround the magnetic material.

11. The system of claim 9, wherein the conductive layer extends at least one of i) around the magnetic material or ii) through the magnetic material.

12. The system of claim 9, wherein the semiconductor device includes at least one of an inductor or a transformer.

* * * * *